(12) United States Patent
Larranaga et al.

(10) Patent No.: US 11,579,534 B2
(45) Date of Patent: Feb. 14, 2023

(54) EXTRACTING A FEATURE FROM A DATA SET

(71) Applicant: ASML NETHERLANDS B.V., Veldhoven (NL)

(72) Inventors: Maialen Larranaga, Eindhoven (NL); Dimitra Gkorou, Eindhoven (NL); Faegheh Hasibi, Eindhoven (NL); Alexander Ypma, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/436,113

(22) PCT Filed: Feb. 6, 2020

(86) PCT No.: PCT/EP2020/052953
§ 371 (c)(1),
(2) Date: Sep. 3, 2021

(87) PCT Pub. No.: WO2020/177973
PCT Pub. Date: Sep. 10, 2020

(65) Prior Publication Data
US 2022/0128908 A1    Apr. 28, 2022

(30) Foreign Application Priority Data
Mar. 6, 2019 (EP) ..................................... 19160933

(51) Int. Cl.
*G03F 7/20* (2006.01)
*G06N 20/00* (2019.01)

(52) U.S. Cl.
CPC ............. *G03F 7/705* (2013.01); *G06N 20/00* (2019.01)

(58) Field of Classification Search
CPC .. G03F 7/70483; G03F 7/705; G03F 7/70616; G06N 20/00
See application file for complete search history.

(56) References Cited

U.S. PATENT DOCUMENTS 10,691,864 B2 *  6/2020  Wang ........................ G03F 1/36
2010/0166289 A1  7/2010  Satake et al.
(Continued)

FOREIGN PATENT DOCUMENTS

TW    201841066    11/2018
TW    201901285    1/2019
(Continued)

OTHER PUBLICATIONS

International Search Report and Written Opinion issued in corresponding PCT Patent Application No. PCT/EP2020/052953, dated May 15, 2020.
(Continued)

*Primary Examiner* — Deoram Persaud
(74) *Attorney, Agent, or Firm* — Pillsbury Winthrop Shaw Pittman LLP

(57) ABSTRACT

A method of extracting a feature from a data set includes iteratively extracting a feature from a data set based on a visualization of a residual pattern within the data set, wherein the feature is distinct from a feature extracted in a previous iteration, and the visualization of the residual pattern uses the feature extracted in the previous iteration. Visualizing the data set using the feature extracted in the previous iteration may include showing residual patterns of attribute data that are relevant to target data. Visualizing the data set using the feature extracted in the previous iteration may involve adding cluster constraints to the data set, based on the feature extracted in the previous iteration. Additionally or alternatively, visualizing the data set using the feature extracted in the previous iteration may involve defining (Continued)

conditional probabilities conditioned on the feature extracted in the previous iteration.

20 Claims, 3 Drawing Sheets

(56) References Cited

U.S. PATENT DOCUMENTS

| | | | | |
|---|---|---|---|---|
| 2018/0300434 | A1* | 10/2018 | Hu | G03F 7/70441 |
| 2019/0147127 | A1* | 5/2019 | Su | G06K 9/6255 |
| | | | | 703/7 |
| 2019/0369503 | A1 | 12/2019 | Ypma et al. | |
| 2020/0050099 | A1 | 2/2020 | Su et al. | |
| 2022/0050387 | A1* | 2/2022 | Van Haren | G03F 7/70675 |

FOREIGN PATENT DOCUMENTS

| | | |
|---|---|---|
| WO | 2018133999 | 7/2018 |
| WO | 2018218249 | 11/2018 |

OTHER PUBLICATIONS

European Search Report issued in corresponding European Patent Application No. 19160933.8, dated Oct. 23, 2019.
Larranaga, M. et al.: "Towards interactive feature selection with human-in-the-loop", IAL Workshog, CEUR Workshog Proceedings, vol. 2192, pp. 85-88 (2018).
Albanese, D. et al.: "A practical tool for Maximal Information Coefficient analysis", GigaScience, giy032, vol. 7 (2018).
Wilber, M.J. et al: "Learning Concept Embeddings with Combined Human-Machine Expertise", Proceedings of the IEEE International Conference on Computer Vision, pp. 981-989, (2015).
Puolamaki, K. et al.: "Interactive Visual Data Exploration with Subjective Feedback: An Information-Theoretic Approach", arXiv:1710.08167 (2017).
Peltonen, J. et al.: "Efficient Optimization for Data Visualization as an Information Retrieval Task", 2012 IEEE International Workshop on Machine Learning for Signal Processing (2012).
McInnes, L. et al.: "UMAP: Uniform Manifold Approximation and Projection for Dimension Reduction", arXiv:1802.03426 (Dec. 7, 2018).

* cited by examiner

EXTRACTING A FEATURE FROM A DATA SET

CROSS-REFERENCE TO RELATED APPLICATIONS

This application is the U.S. national phase entry of PCT Patent Application No. PCT/EP2020/052953 which was filed Feb. 6, 2020, which claims the benefit of priority of European Patent Application No. 19160933.8 which was filed on Mar. 6, 2019 and which is incorporated herein in its entirety by reference.

BACKGROUND

Field of the Invention

The present invention relates to a method of extracting a feature from a data set, usable, for example, in the manufacture of devices by lithographic techniques. The present invention also relates to associated computer programs and computer program products, and apparatus including a lithographic apparatus and a lithographic cell.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

Currently during lithographic processing much context data is generated. This context data is a large set of values of variables associated with measurements and machine/process settings and sensor readings. The quality of the lithographic process is expressed in so-called performance data consisting of a set of values of performance parameters. Performance parameters can be related to CD (critical dimension) control, overlay control (the accuracy of alignment of two layers in a device) or underlying parameters (e.g. focus and dose). Performance data is of great interest as this data allows control of the lithographic process. For example, knowledge of overlay performance will be used to take corrective actions (e.g. by changing machine settings). At the same time knowledge of performance data is instrumental for triggering out-of-range situations (e.g. for process control and finding the cause of out-of-range situation).

Context parameters of lithographic apparatuses (such as scanners) and processing tools influence patterning performance on product substrates in a non-linear way. Due to the complexity of lithographic steps, modeling accurately to predict the effect of these parameters on scanner performance requires a good understanding of the underlying physical processes. Context parameters may include hardware settings and sensor measurements. Context parameters are easily accessible and available for a large number of exposures. As a consequence, access to high-dimensional data sets is provided, resulting in challenging prediction problems (such as layer-to-layer overlay prediction or classification of defects through images). A great amount of time is spent by people, who are domain experts, processing this data. For example such processing includes selecting relevant features for diagnostics, manual feature engineering, finding stable signals, etc.

In this disclosure, we refer to the raw input parameters and signals in the context data set as attributes (e.g., the applied automatic process control loop corrections or wafer stage air temperature). These may be parameters that are obtained directly from sensors in the scanners. Attributes may be selected as features. The parameters and signals that are constructed and/or engineered, transforming the attributes, are also referred to as features (e.g., machine fingerprints). A person skilled in the art of machine learning may use the terms attributes and features to refer to corresponding entities. Thus, features may be selected from attributes by a feature selection process. Also, features may be constructed from transformations or combinations of attributes by a process of feature extraction.

There are various ways to process high-dimensional data sets prior to defining a prediction model (also referred to as learning machine herein). Such approaches include:

1. An approach includes data processing as part of modeling process. In some learning machines the feature extraction and feature selection are part of the modeling process. For example for Artificial Neural Networks (ANN), the feature extraction/construction is a step in the modeling process for ANNs. The "hidden layers" in an ANN learn various representations (i.e., features) of the input data (e.g., pixels of an image of a human face) that are relevant for the prediction of the output value (e.g., emotion).

2. An approach includes data processing prior to modeling. For most learning machines (e.g. decision trees, linear regression, etc.) feature selection and feature extraction are a pre-processing step. This pre-processing may be done using one or various of the following techniques:

2(a) Standardization and normalization: Most attributes are in different scales, standardization and normalization helps making attributes comparable to each other.

2(b) Signal enhancement de-noising or smoothing, and applying filters, help improve the input attributes.

2(c) Linear or nonlinear space embedding methods. These methods allow one to analyze high-dimensional data in lower (more interpretable) dimensions. They also enable the visualization of the data. Suitable methods are Principal Component Analysis (PCA), t-distributed stochastic neighbor embedding (t-SNE), Uniform Manifold Approximation and Projection (UMAP), etc.

2(d) Nonlinear expansions increase dimensionality of the data by creating features multiplying attributes, which helps the learning machine.

The methods mentioned above correspond to a great amount of the available literature for feature selection and extraction.

A generic description on incremental learning is disclosed by international patent application publication WO2018133999, which is incorporated herein by reference.

Problems with previous approaches include the following:

Data exploration may be arduous and time-consuming: Human eyes are not able to retrieve information directly from high-dimensional data sets. Domain experts employ a lot of time analyzing the data to grasp what patterns/fingerprints are present in it that are relevant for the prediction task.

Redundant features and spurious correlations: Redundant features and features that show spurious correlations remain in predictive models and reduce their accuracy of prediction.

"Black-box" styled learning machines: Many learning machines are black boxes, and domain experts have difficulties in understanding why a model works or why it does not. Artificial Neural Networks are very powerful learning machines; however, they are not easily interpretable, and the features they extract cannot be easily understood by domain experts.

Data visualization: Often the dimensionality reduction methods and data visualization methods fail to provide experts with unknown information. Visualizations tend to show patterns that are already well known by domain experts.

Curse of dimensionality and missing out on relevant features: In semiconductor manufacturing data sets are usually high-dimensional data sets with few labeled data points of performance parameters (e.g., expensive measurements). Most learning machines are unable to perform good predictions since they cannot isolate the truly relevant features. Often some of the relevant features will simply be discarded because there is not enough data to assess their relevance properly.

There does not exist a structured way to include knowledge from domain experts into feature extraction and selection for use in predictive models. This knowledge is domain specific and dependent on the problem setting.

SUMMARY

The inventors have devised a way to have a human-aided interactive scheme for data exploration (that is, feature selection and extraction). It is desirable for the extracted features to be easily interpretable and understandable for domain experts. The current disclosure proposes extensions specifically tailored for feature selection and extraction, data clustering and mapping and graph structure learning. It is desirable to have a human-aided framework for feature selection and extraction that will allow users to obtain easily interpretable predictive models, while avoiding or at least mitigating one or more of the associated problems mentioned above.

The invention in a first aspect provides a method of extracting a feature from a data set associated with a semiconductor manufacturing process, the method comprising: iteratively extracting a feature from the data set based on a visualization of a residual pattern comprised within the data set, wherein the feature is distinct from a previous feature extracted in a previous iteration, and the visualization of the residual pattern uses the previous feature.

The method may further comprise performing feature selection using the previous feature extracted in the previous iteration, to exclude use of a feature in providing the visualization.

The invention in a second aspect provides a method of industrial processing comprising the method of extracting a feature from a data set of the first aspect and further comprising using the extracted features to control the industrial process.

The invention in a third aspect provides a computer program comprising computer readable instructions which, when run on suitable computer apparatus, cause the computer apparatus to perform the method of the first aspect.

The invention in a fourth aspect provides a computer program product comprising the computer program of the third aspect.

The invention in a fifth aspect provides an apparatus specifically adapted to carry out the steps of the method of the first aspect. The apparatus may be specifically configured as a lithographic apparatus operable to perform a lithographic production process. The apparatus may be specifically configured as a lithographic cell operable to perform a lithographic production process.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
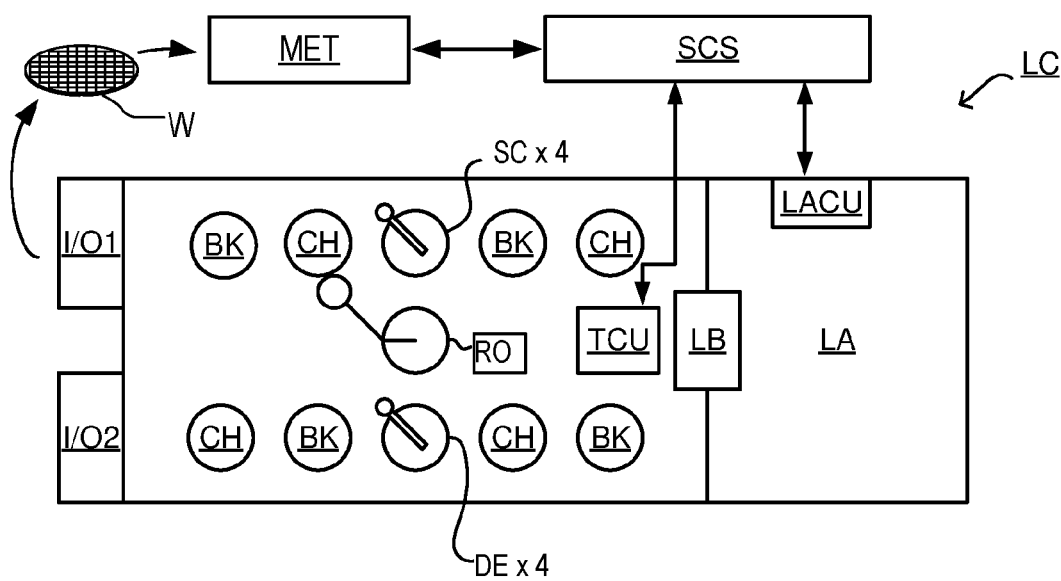
FIG. 1 depicts a lithographic cell or cluster in which a method according to the present invention may be used.

FIG. 1 depicts a lithographic cell or cluster in which an inspection apparatus according to the present invention may be used.

As shown in FIG. 1, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Context parameters of lithographic apparatus (e.g. scanner) exposures, such as exposure energy and image size, can influence scanner performance (and therefore also on-product performance, i.e. patterning performance on product wafers, like overlay or critical dimension) in linear and non-linear ways.

There exist various methods for feature selection and feature extraction. As mentioned above, some of them are part of the modeling itself (see the discussion of ANN above), some others are part of the preprocessing step. Most of these require no input from domain experts; the analysis is done in a pure data-driven fashion. In some other cases manual feature engineering (from domain experts) is used, but this is a time consuming and challenging task. The interactive scheme in embodiments described herein combines data-driven methods with input from human domain experts. Due to this interaction, the output of the method is a pre-processed data set that is human understandable and easily interpretable to later use with other learning machines for prediction tasks such as overlay prediction or root-cause analysis to improve industrial control.

Figure 2:
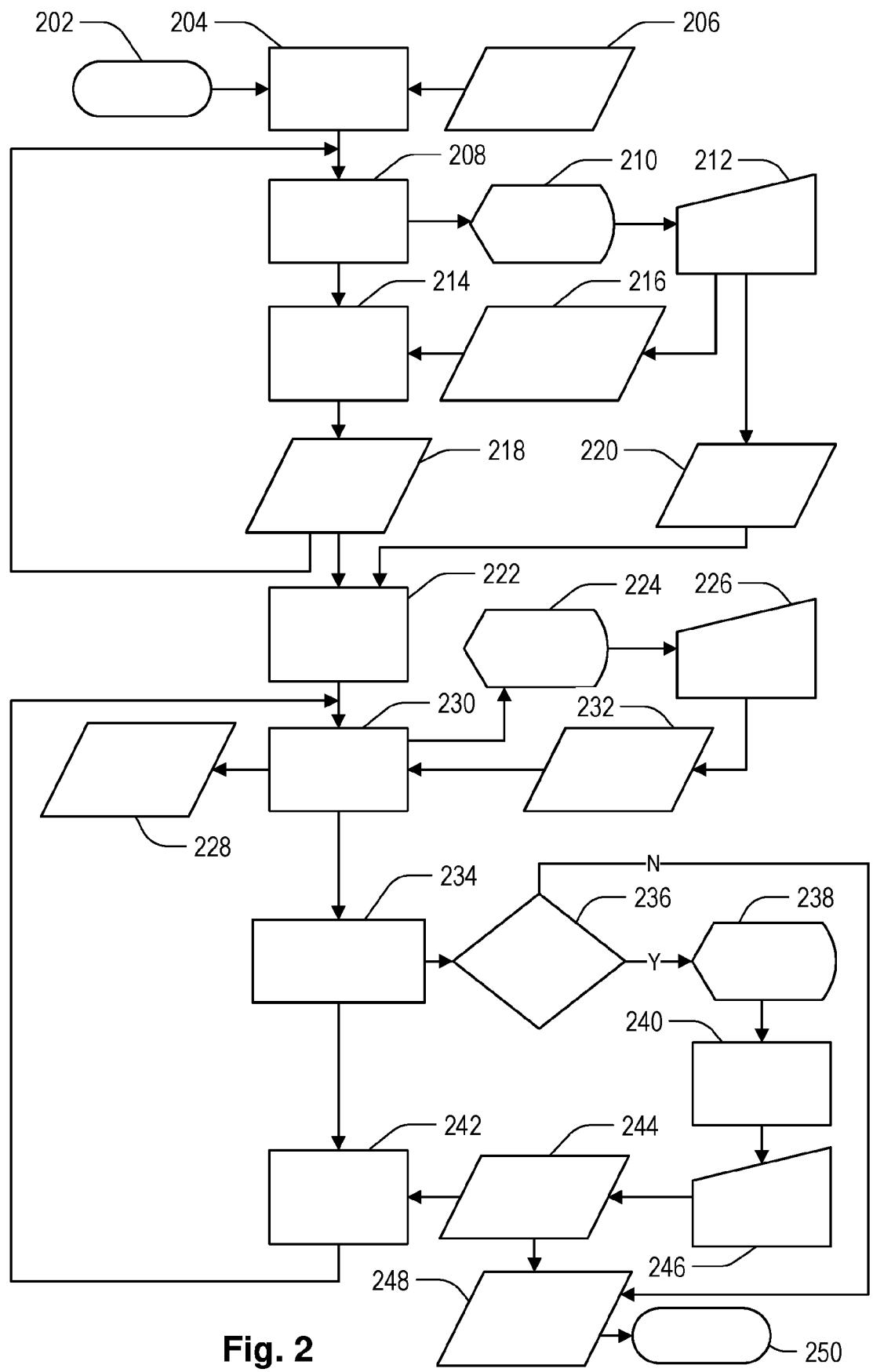
FIG. 2 is a flowchart of a method for selecting and extracting features from a data set according to an embodiment of the present invention.

FIG. 2 is a flowchart of a method of selecting and extracting features from a data set according to an embodiment of the present invention.

The method begins 202 with obtaining 204 attributes and target data from raw data 206. The obtained data set thus comprises attribute data and target data. Attribute data in this example comprises context data related to an industrial lithographic process and target data comprises target performance data related to an industrial lithographic process. Visualizing 208 for clean-up is performed. The visualization 210 is presented on a display. The domain expert observes the display and inputs 212 feedback. The feedback includes attribute relevance and spurious correlations 216. These are used to remove 214 irrelevant features. This produces a clean relevant data set 218. Further clean-up of the data set is performed by looping back to the visualizing step 208. Once the clean-up is complete, the visualization is refined 222 for further feature selection and feature extraction. The refinement 222 may include domain expert input 212 of the structure of data 220.

Steps 208 to 214 thus depict modifying the data set 206 by visualizing 208 the data set to provide a clean-up visualization 210 and removing 214 a feature from the data set based on the clean-up visualization 210. Removing 214 a feature includes receiving 212 user input, in this example relevance features and spurious correlations 216, based on viewing the clean-up visualization 210. Removing 214 a feature based on the clean-up visualization may comprise updating nodes and edges on a graph representation of the data set.

Feature selection 230 outputs a visualization 224 to a display. Upon observing the visualization, the domain expert inputs 226 relevance of features 232 to the feature selection step 230. The feature selection step 230 outputs relevant features that are ranked 228. The feature selection uses the feature extracted in the previous iteration (as depicted by step 242 and the arrow from 242 to 230), to exclude use of a feature in providing the visualization 238.

Visualizing 234 of residual patterns of features correlated to the target is performed. If it is determined 236 that there is no relevant residual patterning then the feature extraction ends 250 with output of the pre-processed data 248. If there is relevant residual patterning 236, the visualization 238 is output to the display. The domain expert engineers 240 new features which are input 246 for extraction of new features 244. These extracted features 244 are output to the pre-processed data 248. The extracted features 244 are also fed forward 242 to the next iteration of feature selection 224 to 232 and feature extraction 234 to 246.

Steps 234 to 246 and the arrows between 242 and 230 and 234 thus depict iteratively extracting a feature 244 from the data set based on a visualization 238 of a residual pattern comprised within the data set, wherein the feature is distinct from a feature extracted in a previous iteration, and the visualization 238 of the residual pattern uses the feature extracted in the previous iteration 244, 242. Visualizing 234 the data set using the feature extracted in the previous iteration may comprise showing residual patterns of the attribute data that are relevant to target data. Visualizing 234 the data set using the feature extracted in the previous iteration may involve adding cluster constraints to the data set, based on the feature extracted in the previous iteration. Additionally or alternatively, visualizing 234 the data set using the feature extracted in the previous iteration may involve defining conditional probabilities conditioned on the feature extracted in the previous iteration.

Extracting a feature comprises receiving user input 240 from a user provided with the respective visualization 238 on the display. The iteration is repeated until 236 no residual pattern is found to be relevant. Determining whether there are relevant residual patterns may be done using a statistical test to determine if patterns in the attribute data correlate to target data.

The extracted features in the pre-processed data 248 may be used to control an industrial process, in this example a lithographic process.

Next, we describe the implementation of the method in more detail.

Steps and data 204-220 are a feature selection phase that relates to cleaning up irrelevant attributes and spurious correlations. This first phase of the interaction with the domain expert is performed to get rid of irrelevant attributes, redundant attributes and attributes that show spurious correlations. For example, in a lithography application: A domain expert knows that (1) the attribute "Grid Size" is not relevant for predicting overlay of implant layers, or (2) that each layer is exposed with a different reticle, and therefore the attribute that corresponds to layer context data is redundant with the attribute corresponding to reticles' context data. Then these attributes can be discarded 214. For low-dimensional data sets (~100 attributes) this can be done manually. For larger data sets this is unfeasible, therefore embodiments use algorithms that elicit the knowledge from domain experts in an efficient and accurate way. There are several possibilities to tackle this phase.

First, knowledge elicitation schemes may be used together with probabilistic methods. A domain expert gives feedback on features' relevance in an iterative manner and the probabilistic predictive model adapts, based on this feedback. Knowledge elicitation methods can be combined with other well-known feature selection methods (e.g., random forest or univariate methods).

Second, we can use a graph representation of data where a user can update the nodes and edges in the graph based on its knowledge.

Several approaches can be used for this feature selection phase, for example:

Bayesian regression models with human input on the relevance of features. In this approach, a human expert provides feedback on the relevance of each feature one by one. This may be useful for data sets of few hundreds of dimensions but does not scale well for data sets with thousands of dimensions. This has been disclosed in M. Larranaga, D. Gkorou, T. Guzella, A. Ypma, F. Hasibi, R. J. van Wijk, Towards interactive feature selection with human-in-the-loop, IAL workshop, pp. 85-88, which is incorporated herein by reference.

Using similarity-based measures (e.g., mutual information-based measures) to characterize the complex associations in large data sets, such as disclosed in Davide Albanese, Samantha Riccadonna, Claudio Donati, Pietro Franceschi; A practical tool for Maximal Information Coefficient analysis, GigaScience, giy032, which is incorporated herein by reference. One can use these techniques to rank features and associate features to come up with graph structures. Graphs can be helpful to perform community detection (group features that are related to each other), or to define causal relationships. A human domain expert may later provide information on the structure of the graph (say if the structure corresponds to an artifact or if it indeed has a physical meaning), or add new nodes and arcs, etc. One can encode the knowledge of the domain expert with a prior on the graph structure and iteratively enhance using the above flow. This further refinement can be done using techniques like transfer entropy (that are computationally intensive) that are only feasible when applied to a reasonable initial structure.

The feature selection phase outputs a clean relevant data set 218.

Steps and data 230 to 250 are an iterative feature selection and extraction phase.

This phase uses a dimensionality reduction method to illustrate the data (using the features that have been judged as relevant by the domain expert in combination with the data-driven feature selection methods in the previous feature selection phase). Here, two key aspects are to be considered:

(1) Prior domain expert/user knowledge: The visualization considers the prior knowledge of the domain expert/user. For example: a domain expert that knows that machine fingerprints are relevant for the prediction of overlay does not want to visualize this particular "pattern". Embodiments provide a method that will adapt to each user, visualizing different aspects of the data depending on what the user already knows. Here one can use different approaches to encode user knowledge. As a first example one can use SNaCK embeddings as disclosed in M. J. Wilber, I. S. Kwak, D. Kriegman, S. Belongie. Learning Concept Embeddings with Combined Human-Machine Expertise (2015) Proceedings of the IEEE International Conference on Computer Vision 981-989, which is incorporated herein by reference. As a second example one can use Subjectively Interesting Data Exploration as disclosed in K. Puolamaki, E. Oikarinen, B. Kang, J. Lijffijt, T. De Bie. Interactive Visual Data Exploration with Subjective Feedback: An Information-Theoretic Approach (2017), which is incorporated herein by reference.

(2) Correlation to target: The visualization 238 shows patterns that are relevant for the target value. There are many unsupervised dimensionality reduction methods (linear: Principal Component Analysis, Independent Component Analysis, etc. nonlinear: t-distributed stochastic neighbor embedding (t-SNE), multidimensional scaling, etc.) that illustrate the structure of the data. However, we are interested in plotting only the "patterns" or structure that is relevant for the prediction task. A suitable method is a supervised dimensionality reduction method like that developed in Neighbor Retrieval Visualizer (NeRV) disclosed in J. Peltonen and K. Georgatzis, Efficient Optimization for Data Visualization as an Information Retrieval Task, MLSP 2012, the 2012 IEEE International Workshop on Machine Learning for Signal Processing, which is incorporated herein by reference. Another suitable method for supervised dimensionality reduction is disclosed in L. McInnes, J. Healy and J. Melville, UMAP: Uniform Manifold Approximation and Projection for Dimension Reduction, https://arxiv.org/abs/1802.03426, which is incorporated herein by reference For the data visualization 234, 238, an approach may be used that is similar to that taken in Puolamaki et al. The approach is to define a prior distribution based on the knowledge that the domain expert already has on the data. For instance, wafers that have been exposed in the same scanners should be more similar to each other than wafers that have been exposed in other scanners. This prior knowledge can be encoded so that the visualization shows other relevant structure different from the scanner (which constitutes well-known information). Once knowledge has been acquired from a visualization the expert communicates 246 this knowledge to the system and the prior distribution is updated based on this new information 242, 234. Then, a new visualization 238 is shown, that presents other previously hidden structures. The approach disclosed in Puolamaki et al is unsupervised, but for use in embodiments described herein it is adapted to a supervised dimensionality reduction approach.

Steps and data 240 to 246 describe feature extraction. How to engineer the features will depend on the task at hand and on the domain expert exploring the data.

In the feature extraction, information is extracted from the visualization 238. The dimensionality reduction method described above (supervised and user dependent) is used for the following purposes: (1) engineer 240 new features and (2) validate the relevance/impact of features. We next explain with an example how it is done. A domain expert observes from the visualization 238 that machine/chuck fingerprints are relevant for the prediction of magnification in y. Once this information 244 is determined, it can be encoded in the visualization 238 of the next iteration by adding 242 this prior knowledge into the dimensionality reduction method 234. The extracted features thus represent prior knowledge 244 of the domain expert that is fed forward 242 to the next iteration. This is encoded 234 into the next visualization by adding cluster constraints to the data or by defining conditional probabilities conditioned on the retrieved information. Thus the next visualization 238 will be adapted to show new unknown structure in the data. This process goes on until 236 the visualization shows no relevant patterning anymore. To decide whether a visualization shows relevant patterning one may use an objective criterion such as; statistical tests to determine if patterns in the attribute data correlate to target.

Embodiments allow domain experts to quickly and efficiently analyze and extract information from high-dimensional data sets. Embodiments provide a structured human-aided interaction that provides interpretable and understandable predictive models.

Embodiments provide subjectively interesting data representation and visualization. Conventionally, many dimensionality reduction and feature extraction methods are used, such as Principal Component Analysis (PCA). However, these are unsupervised methods that not necessarily represent the aspects of the data that are most relevant for the prediction task. Embodiments visualize the interesting patterns of the data that are relevant for the prediction task.

Embodiments adapt the visualization of the data to what the domain expert already knows. Different domain experts might be therefore shown different representations.

Conventional data exploration is arduous and time-consuming. Embodiments, due to the supervised representation methods, visualize the most relevant structure in the data. Also, due to the capability of adapting to each experts' knowledge, the visualizations show unknown structure to the expert. This optimizes the time required for analysis, since interesting information will be represented.

In embodiments, the feature selection is done in collaboration with a domain expert, hence redundant features and spurious correlations will be easily detected and eliminated in an early stage of the exploration process.

For application of embodiments with "black-box" styled learning machines, the extracted features are based on information that human experts retrieve from the visualizations. The expert then constructs new features based on the findings and his/her knowledge on the physical system. This human-machine interaction allows one to construct interpretable features unlike "black-box" learning machines (e.g., ANNs or dimensionality reduction methods like t-SNE) that often extract features that cannot be explained easily by human experts, and are therefore less reliable as generalizable features.

The visualization method in embodiments considers the prior knowledge of the user and also the target to be predicted. Therefore, the visualization is adapted to each user and to each prediction task.

Embodiments also help with the curse of dimensionality and missing out on relevant features. In the feature selection phase, most irrelevant features are spotted by an expert and removed. Therefore, the dimensionality of the data should be significantly reduced and hence the output pre-processed data will not suffer from curse of dimensionality, or from not having enough labeled data.

In conventional approaches, there is no structured way of capturing domain expert's knowledge. Each prediction problem and each data set have their own challenges. It is difficult to have a common knowledge base for all problems. Embodiments provide an interactive scheme that adapts to each data set and each domain expert differently (without any previous assumptions), and offers an iterative process to little-by-little and iteratively grasp most or all the patterns and knowledge hidden in the data.

Embodiments provide a very quick and structured scheme to understand what there is in the data. This helps to get a processed data set with human understandable features.

Embodiments can be combined with learning machines to: improve overlay/focus prediction in a lithographic application, improve root-cause analysis, diagnostics, perform active learning and outlier detection.

Embodiments of the invention may be implemented using a computer program containing one or more sequences of machine-readable instructions describing methods of method of generating predicted data, as described above. This computer program may be executed for example within the control unit LACU of FIG. 1, or some other controller. There may also be provided a data storage medium (e.g., semiconductor memory, magnetic or optical disk) having such a computer program stored therein.

Figure 3:
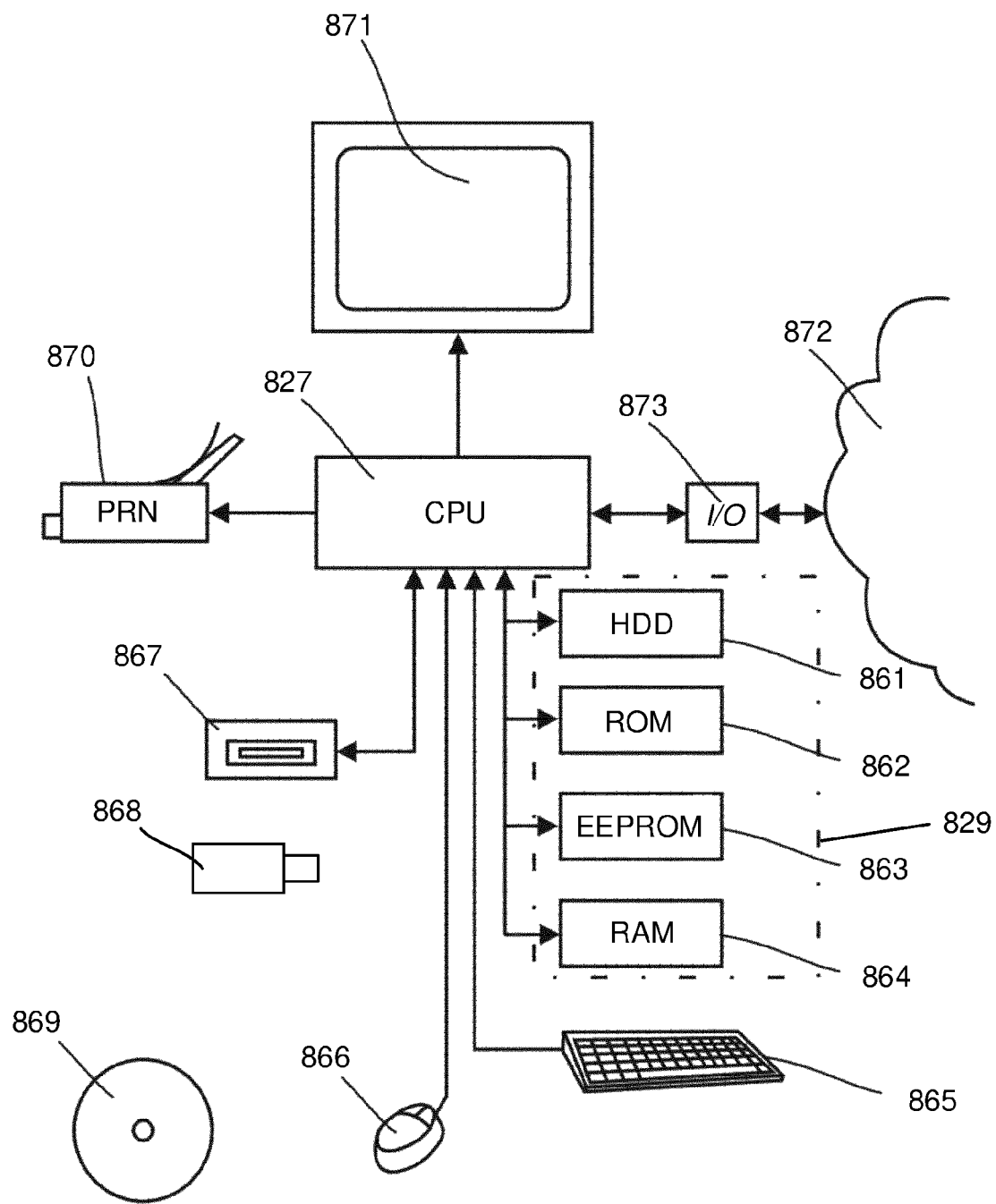
FIG. 3 illustrates computer system hardware useful in implementing the methods disclosed herein.

This control unit LACU may include a computer assembly as shown in FIG. 3. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CDROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an embodiment of the invention external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computer system can be any signal processing system with analogue and/or digital and/or software technology arranged to perform the functions discussed here.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments of the invention are disclosed in the list of numbered clauses below:

1. A method of extracting a feature from a data set, the method comprising:
    iteratively extracting a feature from the data set based on a visualization of a residual pattern comprised within the data set, wherein the feature is distinct from a feature extracted in a previous iteration, and the visualization of the residual pattern uses the feature extracted in the previous iteration.
2. The method of clause 1 wherein extracting a feature comprises receiving user input from a user provided with the respective visualization.
3. The method of clause 1 or clause 2 further comprising modifying the data set by:
    visualizing the data set to provide a clean-up visualization; and
    removing a feature from the data set based on the clean-up visualization.
4. The method of clause 3 wherein the step of removing a feature comprises receiving user input based on viewing the clean-up visualization.
5. The method of clause 4 wherein removing a feature based on the clean-up visualization comprises updating nodes and edges on a graph representation of the data set.
6. The method of any preceding clause further comprising performing feature selection using the feature extracted in the previous iteration, to exclude use of a feature in providing the visualization.
7. The method of any preceding clause wherein the iteration is repeated until no residual pattern is found to be relevant.
8. The method of clause 7 wherein the data set comprises attribute data and target data.
9. The method of clause 8 wherein the method comprises determining whether there are relevant residual patterns using a statistical test to determine if patterns in the attribute data correlates to target data.
10. The method of clause 8 or clause 9 wherein the step of visualizing the data set using the feature extracted in the previous iteration comprises showing residual patterns of the attribute data that are relevant to target data.
11. The method of any of clauses 8 to 10 wherein the attribute data comprises context data related to an industrial process and target data comprises performance data related to an industrial process.
12. The method of any preceding clause wherein visualizing the data set using the feature extracted in the previous iteration comprises adding cluster constraints to the data set, based on the feature extracted in the previous iteration.
13. The method of any preceding clause wherein visualizing the data set using the feature extracted in the previous iteration comprises defining conditional probabilities conditioned on the feature extracted in the previous iteration.
14. A method of industrial processing comprising the method of extracting a feature from a data set of any preceding clause and further comprising using the extracted features to control the industrial process.
15. A computer program comprising computer readable instructions which, when run on suitable computer apparatus, cause the computer apparatus to perform the method of any preceding clause.
16. A computer program product comprising the computer program of clause 15.
17. Apparatus specifically adapted to carry out the steps of the method of any of clauses 1 to 14.
18. Apparatus according to clause 17 specifically configured as a lithographic apparatus operable to perform a lithographic production process.
19. Apparatus according to clause 17 specifically configured as a lithographic cell operable to perform a lithographic production process.

The breadth and scope of the present invention should not be limited by any of the above-described exemplary embodiments, but should be defined only in accordance with the following claims and their equivalents.

The invention claimed is:

1. A method of extracting a feature from a data set associated with a semiconductor manufacturing process, the method comprising:
    iteratively extracting a feature from the data set based on a visualization on a display by a computer system of a residual pattern comprised within the data set,
    wherein the feature is distinct from a previous feature extracted in a previous iteration, and the visualization of the residual pattern uses the previous feature.
2. The method of claim 1, wherein the extracting the feature comprises receiving user input from a user provided with the respective visualization.
3. The method of claim 1, further comprising modifying the data set by:
    visualizing the data set to provide a clean-up visualization; and
    removing a feature from the data set based on the clean-up visualization.
4. The method of claim 3, wherein the removing the feature comprises receiving user input based on viewing the clean-up visualization.
5. The method of claim 4, wherein the removing the feature based on the clean-up visualization comprises updating nodes and edges on a graph representation of the data set.
6. The method of claim 1, further comprising performing feature selection using the previous feature to exclude use of the feature in providing the visualization.
7. The method of claim 1, wherein the iteration is repeated until no residual pattern is found to be relevant.
8. The method of claim 1, wherein the data set comprises attribute data and target data.

9. The method of claim 8, further comprising determining whether there are one or more relevant residual patterns using a statistical test to determine if one or more patterns in the attribute data correlates to target data.

10. The method of claim 8, wherein the visualizing using the previous feature comprises showing one or more residual patterns of the attribute data that are relevant to the target data.

11. The method of claim 8, wherein the attribute data comprises context data related to the semiconductor manufacturing process and the target data comprises performance data related to the semiconductor manufacturing process.

12. The method of claim 1, wherein visualizing using the previous feature comprises adding cluster constraints to the data set, based on the previous feature.

13. The method of claim 1, wherein visualizing using the previous feature comprises defining conditional probabilities conditioned on the previous feature.

14. A method comprising:
the method of extracting a feature from a data set of claim 1; and
using the extracted feature to control a semiconductor manufacturing process.

15. A non-transitory computer program product comprising computer readable instructions therein, the instructions, when run on a suitable computer apparatus, configured to cause the computer apparatus to iteratively extract a feature from a data set based on a visualization on a display by a computer system of a residual pattern comprised within the data set, wherein the feature is distinct from a previous feature extracted in a previous iteration, and the visualization of the residual pattern uses the previous feature.

16. The computer program product of claim 15, wherein the instructions configured to iteratively extract the feature comprise instructions configured to receive user input from a user provided with the respective visualization.

17. The computer program product of claim 15, further comprising instructions configured to modify the data set by: visualizing the data set to provide a clean-up visualization; and removing a feature from the data set based on the clean-up visualization.

18. The computer program product of claim 15, further comprising instructions configured to perform feature selection using the previous feature to exclude use of the feature in providing the visualization.

19. The computer program product of claim 15, wherein the instructions configured to iteratively extract the feature are executed until no residual pattern is found to be relevant.

20. The computer program product of claim 15, wherein the instructions configured to visualize using the previous feature comprise instructions configured to: 1) add cluster constraints to the data set, based on the previous feature, and/or 2) define conditional probabilities conditioned on the previous feature.

* * * * *